United States Patent
Voutsas

(10) Patent No.: US 6,645,454 B2
(45) Date of Patent: Nov. 11, 2003

(54) SYSTEM AND METHOD FOR REGULATING LATERAL GROWTH IN LASER IRRADIATED SILICON FILMS

(75) Inventor: Apostolos Voutsas, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 70 days.

(21) Appl. No.: 09/894,940

(22) Filed: Jun. 28, 2001

(65) Prior Publication Data

US 2003/0000455 A1 Jan. 2, 2003

(51) Int. Cl.$^7$ ............................................... C30B 29/06
(52) U.S. Cl. ........................... 423/348; 117/43; 117/44; 117/46; 117/903; 117/933
(58) Field of Search ............................... 117/43, 44, 46, 117/933, 903; 423/348

(56) References Cited

U.S. PATENT DOCUMENTS

| | | | | |
|---|---|---|---|---|
| 4,234,356 A | * | 11/1980 | Auston et al. | 148/1.5 |
| 5,145,808 A | * | 9/1992 | Sameshima et al. | 437/173 |
| 5,322,589 A | * | 6/1994 | Matsuoka et al. | 437/173 |
| H1637 H | * | 3/1997 | Offord et al. | 437/173 |
| 6,113,689 A | * | 9/2000 | Moon | 117/933 |
| 6,451,631 B1 | * | 9/2002 | Grigoropoulos et al. | 438/149 |

* cited by examiner

Primary Examiner—Robert Kunemund
(74) Attorney, Agent, or Firm—David C. Ripma; Matthew D. Rabdau; Scott C. Krieger

(57) ABSTRACT

A method is provided for maintaining a planar surface as crystal grains are laterally grown in the fabrication of crystallized silicon films. The method comprises: forming a film of amorphous silicon with a surface and a plurality of areas; irradiating each adjacent areas of the silicon film with a first sequence of laser pulses; and, in response to the first sequence of laser pulses, controlling the planarization of the silicon film surface between adjacent areas of the silicon film as the crystal grains are laterally grown. By controlling the number of laser pulses in the sequence, the temporal separation between pulses, and the relative intensity of the pulses, the lateral growth length characteristics of the crystal grains can be traded against the silicon film flatness. A silicon film formed by a pulsed laser sequence crystallization process is also provided.

10 Claims, 6 Drawing Sheets

SYSTEM AND METHOD FOR REGULATING LATERAL GROWTH IN LASER IRRADIATED SILICON FILMS

BACKGROUND OF THE INVENTION

1. Field of the Invention

This invention generally relates to liquid crystal display (LCD) and integrated circuit (IC) fabrication and, more particularly, to a silicon film and fabrication process to laser irradiate silicon film in making polycrystalline silicon thin film transistors (TFTs) for Active Matrix (AM) LCDs.

2. Description of the Related Art

Lateral crystallization by excimer-laser anneal (LC-ELA) is a desirable method for forming high quality polycrystalline silicon films having large and uniform grains. Further, this process permits precise control of the grain boundary locations.

FIGS. 1a through 1d illustrate steps in an LC-ELA annealing process (prior art). As seen in FIG. 1a, initially amorphous silicon film 100 is irradiated by a laser beam that is shaped by an appropriate mask to an array of narrow "beamlets". The shape of the beamlets can vary. In FIGS. 1a–1d, each beamlet is shaped as a straight slit of narrow width, approximately 3–5 microns ($\mu$m). This slit is represented in the figures as the two heavy lines. The width of the slit is the distance between these two lines. This width can vary, but ultimately it is dependent upon the attainable lateral growth length (LGL), which is defined as the distance crystals can grow laterally (inwardly) from the edges of the irradiated area. Typically, the beamlet width is designed to be slightly less than twice the corresponding LGL.

The sequence of FIGS. 1a–1d illustrates the growth of long polysilicon grains by LC-ELA process. A step-and-repeat approach is used. The laser beamlet width (indicated by the 2 parallel, heavy black lines) irradiates the film and, then steps a distance (d), to point 102, smaller than half of the lateral growth length (L), i.e. d<L/2. Using this step-and-repeat process, it is possible to continually grow crystal grains from the point of the initial irradiation, to the point where the irradiation steps cease.

FIG. 2 is partial cross-sectional view of FIG. 1a illustrating the surface topography of laser-irradiated domains (prior art). After the completion of the lateral growth, the two crystal fronts meet at the center of the domain where they form a "boundary" between the two crystal regions developing from each opposing edge of the domain. As a result of the grain boundary formation, a "ridge" 102 develops at the surface of the film at the boundary, corresponding to the planned congruence of the two crystal fronts. Since the substrate steps under the beam a distance of d, where d is less than L/2, the ridge 102 is irradiated is a subsequent shot. This ridge 102 remelts and locally planarizes. However, as part of the same process, another ridge is formed at a new location. Therefore, the ridge location will "march" across the substrate in response to the scans under the beam.

FIG. 3 is the silicon film 100 of FIG. 2 schematically illustrating the evolution, or the ridge 102 motion pattern after 1, 2, 3 and "n" shots (prior art). After "n" shots, the region between adjacent mask slits has been completely crystallized by lateral growth. Consequently, ridges form at positions corresponding (approximately) to the centerlines of the adjacent mask features (i.e. slits). Alternately stated, the film region irradiated by a first slit (the first beamlet in the figure) in the laser mask forms a ridge as a result of the final irradiation shot, at the boundary of where an adjacent slit (the second beamlet in the figure) performed its initial irradiation shot. There is a ridge between each area of the film where the different beamlets have performed their final irradiation shot.

It would be beneficial to reduce the size of the ridges formed by the above-mentioned process. It will be even more advantageous to completely eliminate the height variation along the laterally crystallized domain. Such an improvement would relax the positional constraint for the TFT channels formed in an LCD substrate. When roughness (ridges) develops at specific positions 102 (as shown in FIG. 3), the TFT channels need to be arranged to avoid these regions. That is, the TFTs need to be formed in the planar regions between neighboring ridges to avoid performance deterioration. Even more undesirable is the formation of neighboring TFTs with different performance parameters, resulting from the random formation of TFT channels with ridges adjacent TFT channels without ridges. Hence, some sort of alignment is necessary between the crystallized domains and the position of the TFT channels within these domains. This alignment process introduces additional processing steps, hence increases the cost of the process. It would be desirable to eliminate these additional processing steps so that TFT channels can be placed on the processed (laterally crystallized) film without the requirement of calculating ridge alignments.

It will also be desirable if the same process that enables such a surface roughness (ridge) reduction could be used to improve the lateral growth length (LGL) during crystallization. Such improvement would enable an increase of the stepping distance between successive shots. That is, the pitch, or step distance d between shots could be increased (see FIG. 3). The stepping distance of the substrate is a crucial determinant of the process throughput and, hence, in the economics of the LC-ELA process for mass production. The stepping distance depends critically upon the lateral growth length (LGL). LGL is affected by the transient temperature profile of the film, which defines the time possible for the lateral propagation of the two facing crystal fronts, before the remaining molten volume becomes cold enough to trigger copious (explosive) nucleation.

SUMMARY OF THE INVENTION

The present invention is a method that results in reduction of the surface ridges on laterally crystallized silicon films and/or the enhancement of the lateral growth length. Depending upon the operating conditions, the method can be applied to reduce the surface ridges, increase the lateral growth length, or achieve a compromise between the two. The method utilizes the temporal separation of laser pulses to achieve remelting and planarization of the surface of silicon films or, alternatively, provides additional thermal energy to the molten silicon film to prolong lateral growth.

Accordingly, a method is provided for maintaining a planar surface as crystal grains are laterally grown in the fabrication of crystallized silicon films. The method comprises: forming a film of amorphous silicon with a surface and a plurality of areas; irradiating each adjacent areas of the silicon film with a first sequence of laser pulses; and, in response to the first sequence of laser pulses, controlling the planarization of the silicon film surface between adjacent areas of the silicon film as the crystal grains are laterally grown.

When irradiating areas of the silicon film with a first sequence of laser pulses, there is a temporal separation between pulses in the range from 30 to 500 nanoseconds (ns). Further, the pulses have a pulse width in the range of 20 to 100 ns, as measured at their full-width-half-maximum (FWHM).

Irradiating areas of the silicon film with a first sequence of laser pulses also includes irradiating with a sequence of pulses having a first pulse with a first intensity and a second pulse with a second intensity. The first and second intensities need not be the same. When lateral growth length is the chief object of the process, the second intensity is typically close to the first intensity and the separation between pulses is smaller. However, when surface planarization is the chief object, the second intensity is typically significantly less than the first intensity and the separation between pulses is greater.

Additional details of the above-described method, and a silicon film formed with a pulsed laser sequence crystallization process are presented in detail below.

DETAILED DESCRIPTION OF THE PREFERRED EMBODIMENTS

Figure 1A:
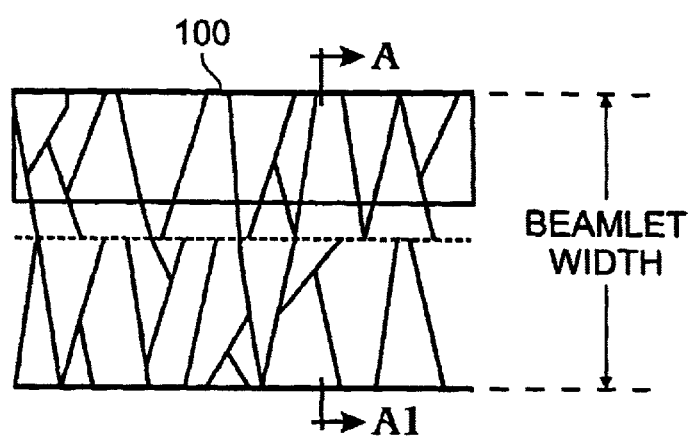
FIGS. 1a through 1d illustrate steps in an LC-ELA annealing process (prior art).
Figure 1B:
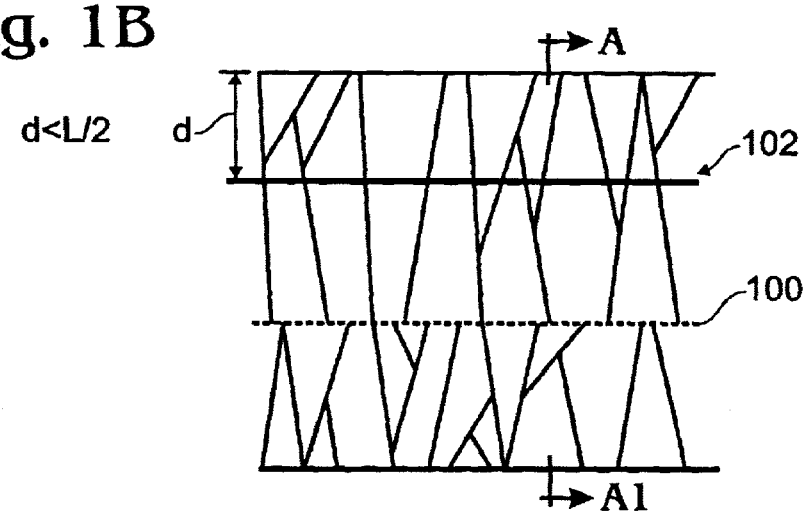
Figure 1C:
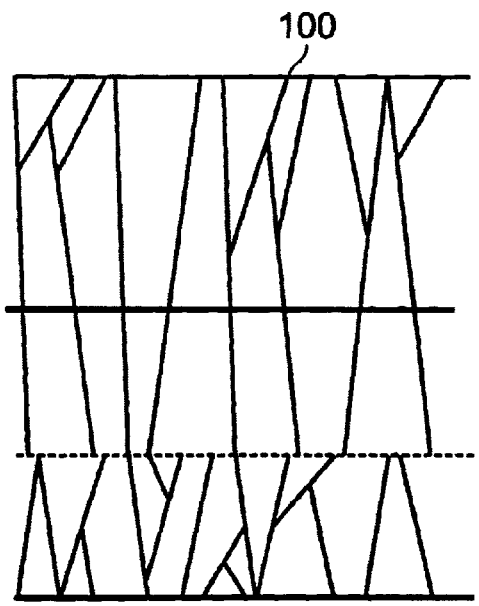
Figure 1D:
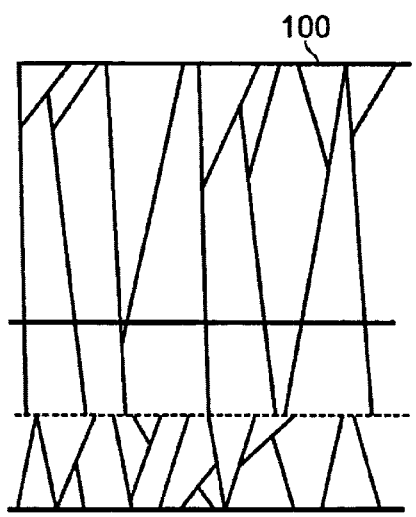
Figure 2:
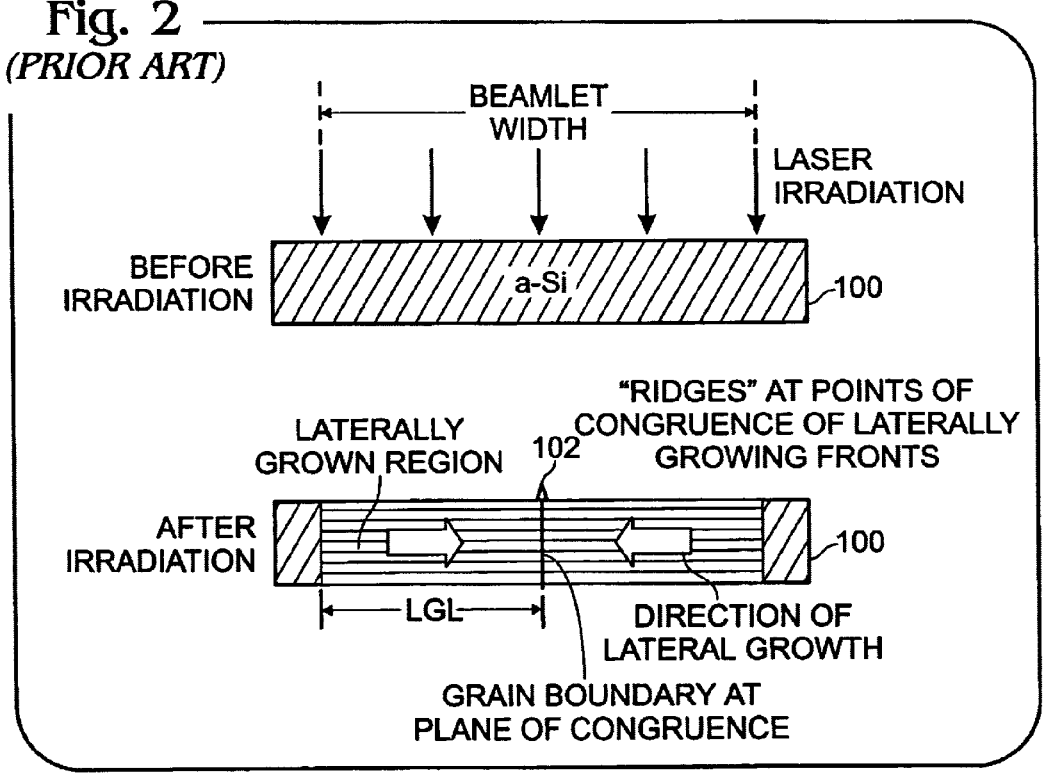
FIG. 2 is partial cross-sectional view of FIG. 1a illustrating the surface topography of laser-irradiated domains (prior art.
Figure 3:
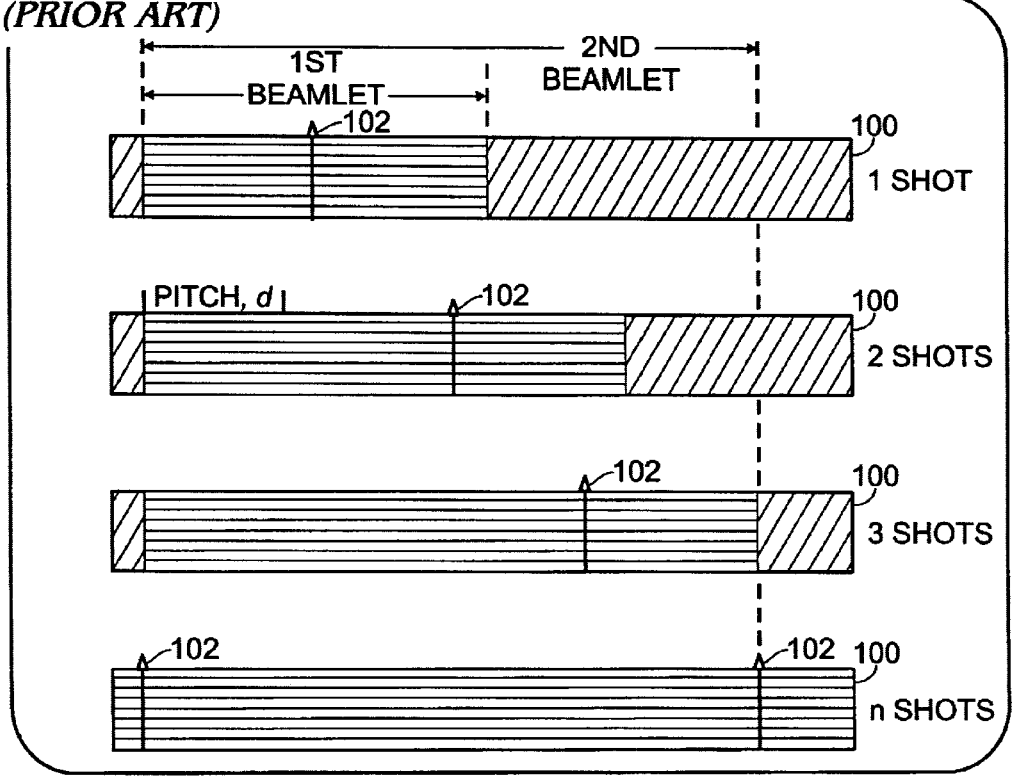
FIG. 3 is the silicon film of FIG. 2 schematically illustrating the evolution, or the ridge motion pattern after 1, 2, 3 and "n" shots (prior art).
Figure 4:
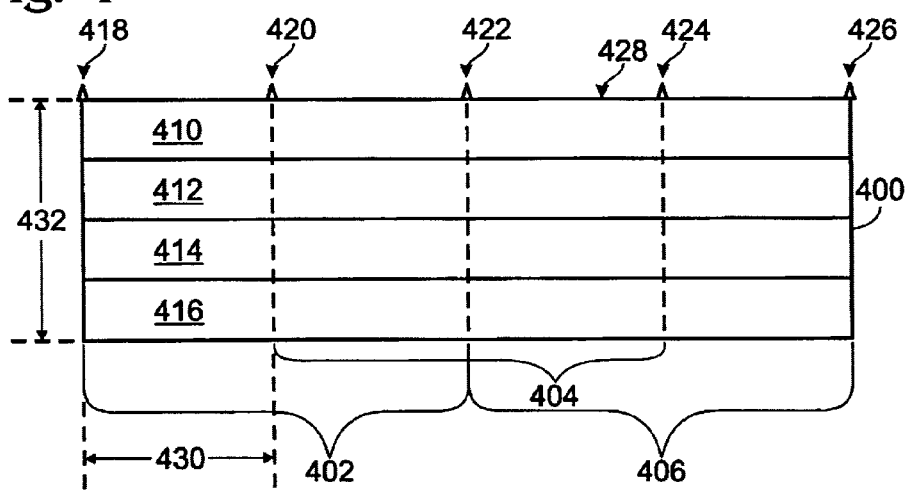
FIG. 4 is a partial cross-sectional view of the present invention silicon film formed from a pulsed laser sequence crystallization process.

FIG. 4 is a partial cross-sectional view of the present invention silicon film formed from a pulsed laser sequence crystallization process. The silicon film 400 has a plurality of irradiation areas. Areas 402, 404, and 406 are shown, but the film 400 is not limited to a particular number of areas. These irradiation areas correspond to beamlet widths as the laser shots step across the film 400. Crystal grains 410, 412, 414, and 416 are shown.

A plurality of temporary ridges 418, 420, 422, 424, and 426 are formed at the center of each irradiation area. A planar silicon film surface 428 extends across the silicon film irradiation areas 402, 404, and 406. During processing, the lateral growth length 430 per shot is greater than 2.5 microns. That is, the crystal grain lengths are extended at least 2.5 microns for every laser step. Typically, the silicon film 400 has a thickness 432 in the range of 100 to 1000 Å.

Figure 5:
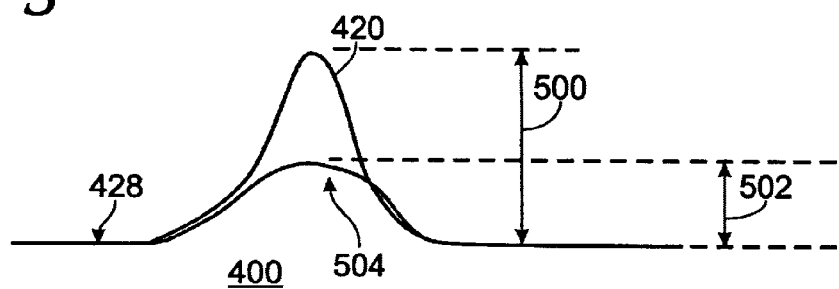
FIG. 5 illustrates the temporary ridge of FIG. 4 in greater detail.

FIG. 5 illustrates the temporary ridge 420 of FIG. 4 in greater detail. Temporary ridge 420, which is representative of the other temporary ridges, has a height 500 in the range of 600 to 1000 Angstroms (Å). As discussed in greater detail below, the temporary ridge is formed after the first pulse or sequence of laser pulses, and is reduced in size as a result of subsequent pulses in a sequence of pulses or subsequent irradiation shots. The planar silicon film surface 428 extending across the silicon film irradiation areas has a flatness 502 in the range of 50 to 500 Å. Alternately stated, the film 400 has permanent ridge, such as permanent ridge 504 with a height in the range of 50 to 500 Å. Preferably, the permanent ridge 504 (or surface flatness 502) is in the range of 50 to 200 Å. As explained in more detail below, the temporary ridge 420 is flattened, or reduced in height as a result of a laser pulse (or pulses) subsequent laser pulses.

As mentioned above, the present invention utilizes the temporal separation of laser pulses to achieve remelting and planarization of the surface of silicon films. Alternately, the temporal separation provides additional thermal energy to the molten silicon film to prolong lateral growth. Such temporal separation of the laser pulses can be achieved by passing the laser pulse through a pulse extender unit. The function of the pulse extender is to prolong the duration of the pulse that is generated from the excimer laser. This is accomplished by introducing the initial laser beam in a specially designed array of beam splitters and mirrors, which split the beam in several parts and bounce each part several times, within the unit, before recombining all parts at the exit. As a result of the multiple bounces in the unit, the recombined beam features a longer pulse, with a duration that is determined by the optical design of the extender (i.e. the number of splitters). Further exploiting the design of the extender, instead of simply prolonged pulse duration, a temporal beam profile consisting of multiple pulses can be formed, having adjustable and controllable temporal separations and/or intensities. The extent of temporal separation and the control of the intensity of the individual pulses are key parameters for this invention. Some applications of the invention are illustrated in the following examples.

EXAMPLE 1

Maximum Surface Planarization

Figure 6:
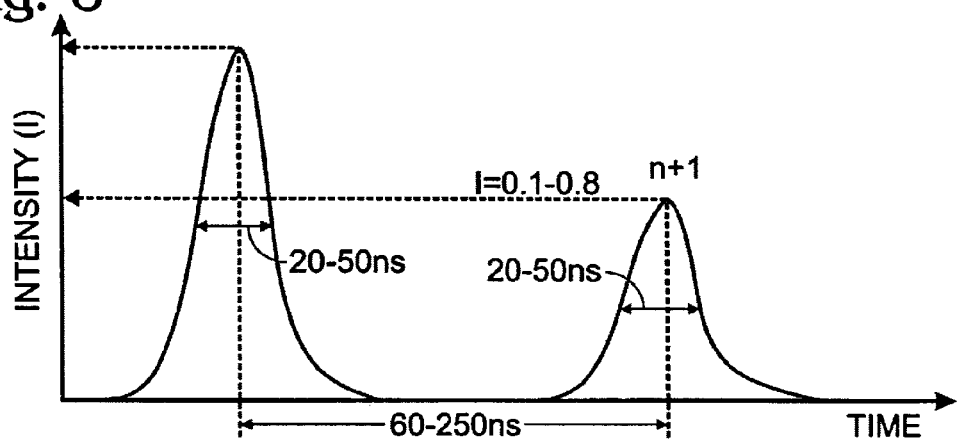
FIG. 6 illustrates a temporal beam profile at the output of the pulse extender designed to maximize surface flatness.

FIG. 6 illustrates a temporal beam profile at the output of the pulse extender designed to maximize surface flatness. Two pulses are shown in this case, but in principle more pulses could be generated, if so desired. The second pulse (second, in a temporal sense) has a lower intensity than the first, and it is well-separated from the first pulse. That is, the temporal separation between the two pulses is greater than the pulse duration of either pulse, with the pulse duration measured at the Full-Width-Half-Maximum (FWHM) of the pulse. Typical ranges for the various properties of the pulses are shown in FIG. 6. Typically, the pulse duration of either (both) pulses is in the range of 20–50 ns, however, longer pulses may be desirable for larger intensity pulses, measured at FHWM. The temporal separation between pulses is in the range of 60–250 ns, although wider ranges may be useful. The relative intensity reduction between pulse n and pulse n+1 is in the range of 20 to 90%. In other words, the most recent pulse has a reduced intensity with respect to its predecessor.

EXAMPLE 2

Maximum Lateral Growth Length

Figure 7:
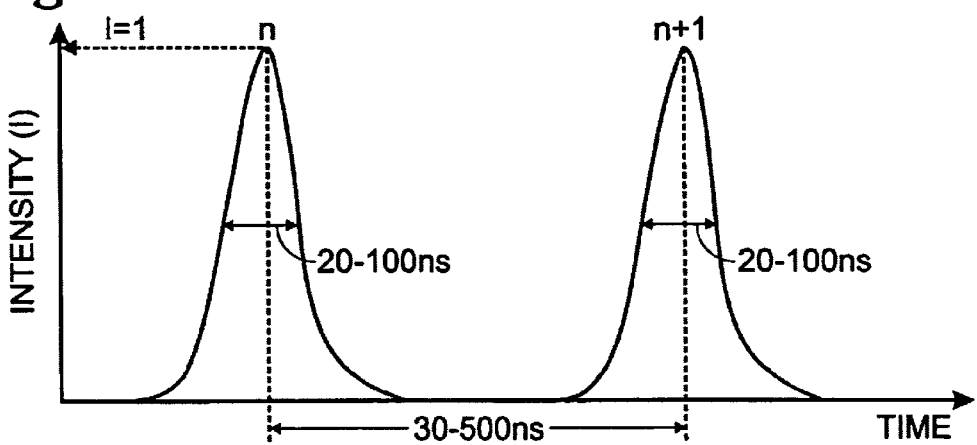
FIG. 7 illustrates the temporal beam profile at the exit of the pulse extender designed to maximize lateral growth length.

FIG. 7 illustrates the temporal beam profile at the exit of the pulse extender designed to maximize lateral growth length. Again two pulses are shown, but in principle more pulses could be generated. An important element of this process is to make the second pulse (or other subsequent pulses) of a similar intensity to the first pulse. Further, the temporal separation between the two pulses is less than the pulse duration of either, with the pulse duration measured at the FWHM of the pulse. Typical ranges for the various properties of the pulses are shown in FIG. 7. The pulse duration (for either pulse) is in the range of 20–100 ns, measured at the FWHM. The temporal separation between pulses is in the range of 30–500 ns. The relative intensity between pulse n and pulse n+1 is approximately the same. In other words, the intensity of the subsequent pulse is similar to its predecessor.

EXAMPLE 3

Comprise Between Planarization and Lateral Growth Length

Figure 8:
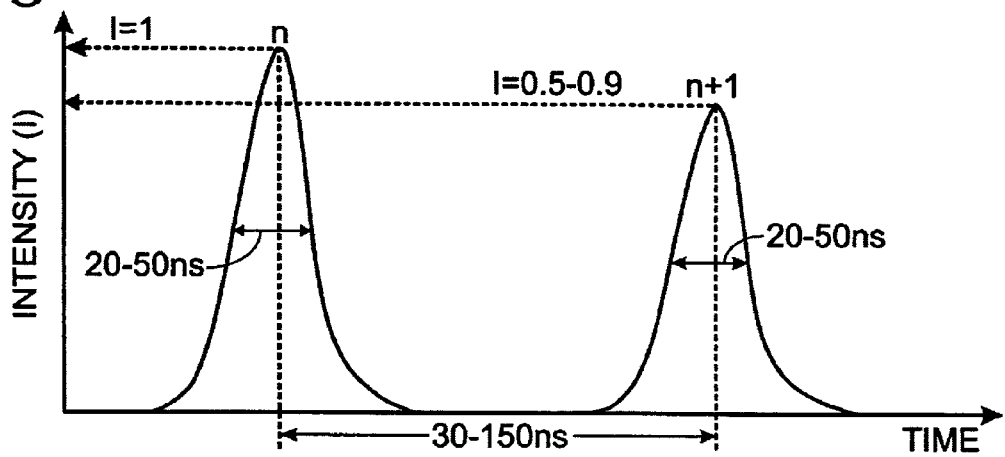
FIG. 8 illustrates the temporal beam profile at the exit of the pulse extender designed to compromise between the goals of surface flatness and lateral growth length.

FIG. 8 illustrates the temporal beam profile at the exit of the pulse extender designed to compromise between the goals of surface flatness and lateral growth length. Two pulses are shown, but the invention is not limited to any particular number of pulses. To achieve a reasonable compromise between these goals, the temporal pulse separation is not too large and the pulse intensity is not too similar. Typical ranges for the various properties of the pulses are shown in FIG. 8. The pulse duration (for either pulse) is 20–50 ns, measured at the FWHM, the temporal separation between pulses is 30–150 ns, and the relative intensity is reduced in the range of 10%–50% between pulse n and pulse n+1. In other words, the intensity of the subsequent pulse is 50–90% that of its predecessor.

Figure 9:
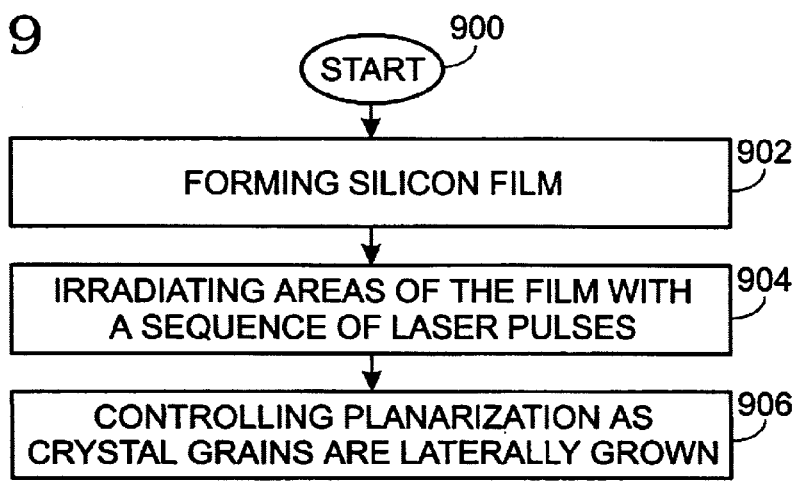
FIG. 9 is a flowchart illustrating the present invention method for maintaining a planar surface as crystal grains are laterally grown in the fabrication of crystallized silicon films.

FIG. 9 is a flowchart illustrating the present invention method for maintaining a planar surface as crystal grains are laterally grown in the fabrication of crystallized silicon films. Although the method, and the methods describing FIGS. 10–12 below, is depicted as a sequence of numbered steps for clarity, no order should be inferred from the numbering unless explicitly stated. The method starts at Step 900. Step 902 forms a film of amorphous silicon with a surface and a plurality of areas. Step 904 irradiates areas of the silicon film with a first sequence of laser pulses. Step 906, in response to the first sequence of laser pulses, controls the planarization of the silicon film surface as crystal grains are laterally grown.

Step 904 includes irradiating with a sequence of pulses having a temporal separation between pulses in the range from 30 to 500 nanoseconds (ns). Further, irradiating areas of the silicon film with a first sequence of laser pulses in Step 904 includes irradiating with a sequence of pulses having a pulse width and a pulse intensity. Typically, the pulses have a pulse width in the range of 20 to 100 ns, as measured at their full-width-half-maximum. It is also typical that irradiating areas of the silicon film with a first sequence of laser pulses includes irradiating with a laser having a beam width greater than 2.5 microns.

In some aspects of the invention, Step 904 includes irradiating with a sequence of pulses having a first pulse with a first intensity and a second pulse with a second intensity equal to the first intensity. Alternately, the second intensity is different than the first intensity, with the first intensity being greater than the second intensity. In some aspects, the second intensity is in the range of 0.1 to 0.8 of the first intensity. Then, the sequence of pulses have a first pulse width, as measured at their full-width-half-maximum, and a separation between pulses that is greater than the first pulse width.

In other aspects of the invention, the second intensity is in the range of 0.5 to 0.9 of the first intensity, and the sequence of pulses have a first pulse width, as measured at their full-width-half-maximum, and a separation between pulses that is less than the first pulse width.

Irradiating areas of the silicon film with a first sequence of laser pulses in Step 904 includes irradiating with a laser wavelength of less than 550 nanometers.

In some aspects of the invention, forming a film of amorphous silicon with a surface and a plurality of areas in Step 902 includes forming areas having a first length equal to the beam width. Then, controlling the planarization of the silicon film surface as the crystal grains are laterally grown in Step 906 includes laterally growing crystal grains by a length approximately equal to one-half the first length.

Controlling the planarization of the silicon film surface as crystal grains are laterally grown in Step 906 includes controlling the silicon surface flatness within a range of 50 to 500 Å. Preferably, the silicon surface flatness is within a range of 50 to 200 Å.

In some aspects, forming a film of amorphous silicon with a surface and a plurality of areas in Step 902 includes forming a silicon film having a thickness in the range of 100 to 1000 Angstroms.

Figure 10:
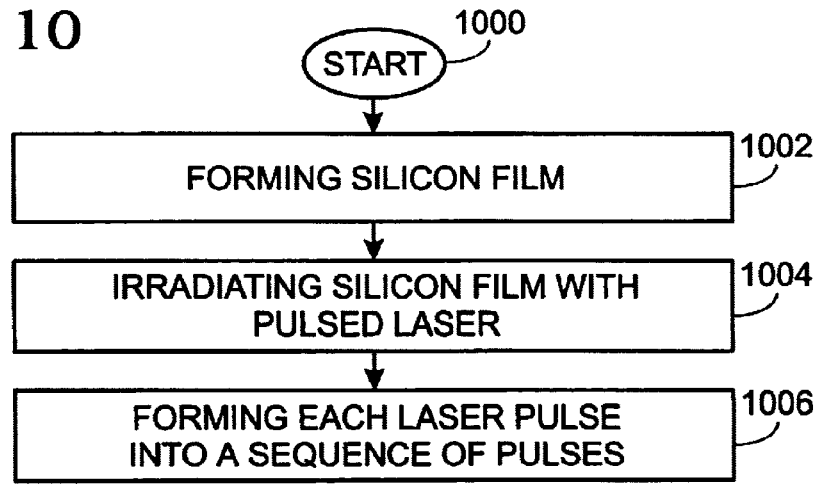
FIG. 10 is a flowchart illustrating the present invention method for regulating the lateral growth of crystal grains in the fabrication of crystallized silicon films.

FIG. 10 is a flowchart illustrating the present invention method for regulating the lateral growth of crystal grains in the fabrication of crystallized silicon films. The method begins at Step 1000. Step 1002 forms a film of amorphous silicon with a surface and a thickness in the range of 100 to 1000 Angstroms. Step 1004 irradiates the silicon film with a pulsed laser having a beam width greater than 2.5 microns and a laser wavelength of less than 550 nanometers. Step 1006 forms each laser shot into a sequence of laser pulses to extend the lateral growth of crystal grains in the silicon film.

Forming each laser shot into a sequence of laser pulses in Step 1006 includes forming a sequence of pulses having a temporal separation between pulses in the range from 30 to 500 nanoseconds (ns). Forming each laser shot into a sequence of pulses having a temporal separation between pulses also includes irradiating with a sequence of pulses having a pulse width in the range of 20 to 100 ns, as measured at their full-width-half-maximum.

Forming each laser shot into a sequence of laser pulses in Step 1006 includes forming a sequence of pulses having a first pulse with a first intensity and a second pulse with a second intensity equal to the first intensity. Alternately, the second intensity is different than the first intensity, with the first intensity being greater than the second intensity.

When forming a sequence of pulses (Step 1006) having the second intensity being in the range of 0.1 to 0.8 of the first intensity, the sequence of pulses has a first pulse width, as measured at their full-width-half-maximum, and a separation between pulses that is greater than the first pulse width. When forming a sequence of pulses having the second intensity being in the range of 0.5 to 0.9 of the first intensity, the separation between pulses that is less than the first pulse width.

In some aspects, Step 1004 of irradiating the silicon film with a pulsed laser includes irradiating in steps across the silicon film surface in steps having a first length, and forming each laser pulse into a sequence of laser pulses to extend the lateral growth of crystal grains in the silicon film in Step 1006 includes laterally growing crystal grains by a length approximately equal to the first length.

Figure 11:
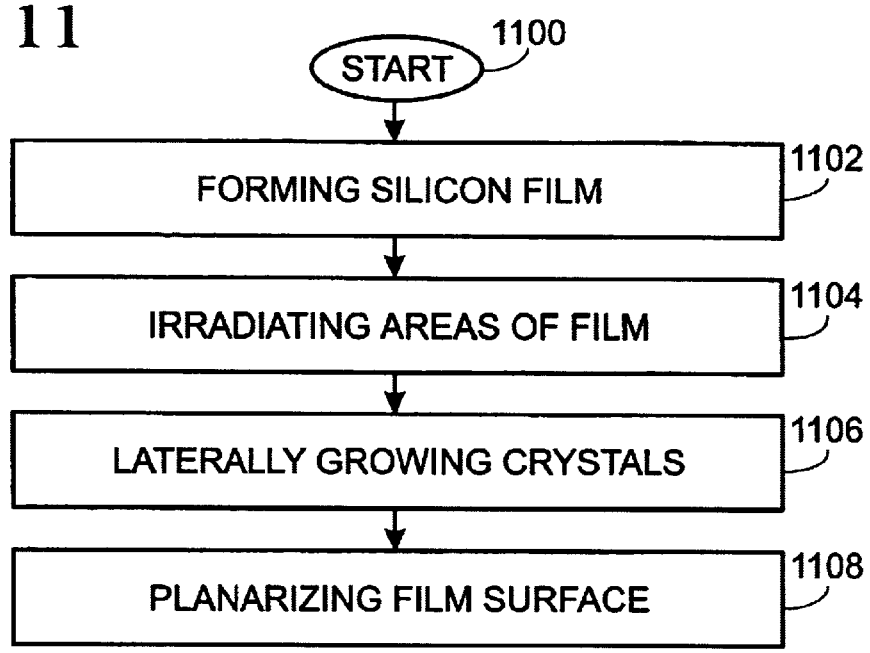
FIG. 11 is a flowchart illustrating the present invention method for planarizing a surface as crystal grains are laterally grown in the fabrication of crystallized silicon films.

FIG. 11 is a flowchart illustrating the present invention method for planarizing a surface as crystal grains are laterally grown in the fabrication of crystallized silicon films. The method starts at Step 1100. Step 1102 forms a film of amorphous silicon with a surface, a plurality of areas, and a thickness in the range of 100 to 1000 Angstroms. Step 1104 irradiates each area of the silicon film with a laser pulse sequence. Step 1106, in response to a first pulse in the pulse sequence, laterally grows crystal grains in the silicon film. Step 1108, in response to a second pulse in the pulse sequence, planarizes the silicon film surface.

Irradiating each area of the silicon film with a laser pulse sequence in Step 1104 includes the first and second pulses having a temporal separation in the range from 30 to 500 nanoseconds (ns). Irradiating each area of the silicon film with a laser pulse sequence also includes forming a first pulse with a pulse width and forming a second pulse with a pulse width in the range of 20 to 100 ns, as measured at their full-width-half-maximum.

Irradiating each area of the silicon film with a laser pulse sequence in Step 1104 includes irradiating with a laser having a beam width greater than 2.5 microns and a laser wavelength of less than 550 nanometers.

Irradiating each area of the silicon film with a laser pulse sequence in Step 1104 includes forming the first pulse with a first intensity and a second pulse with a second intensity different than the first intensity, with the first intensity being greater than the second intensity.

When Step 1104 includes the second intensity being in the range of 0.1 to 0.8 of the first intensity and the sequence of pulses have a first pulse width, as measured at their full-width-half-maximum, the separation between pulses is greater than the first pulse width. When the second intensity is in the range of 0.5 to 0.9 of the first intensity, the separation between pulses that is less than the first pulse width.

Planarizing the silicon film surface in Step 1108 includes controlling the silicon surface flatness within a range of 50 to 500 Å, preferably within a range of 50 to 200 Å.

Figure 12:
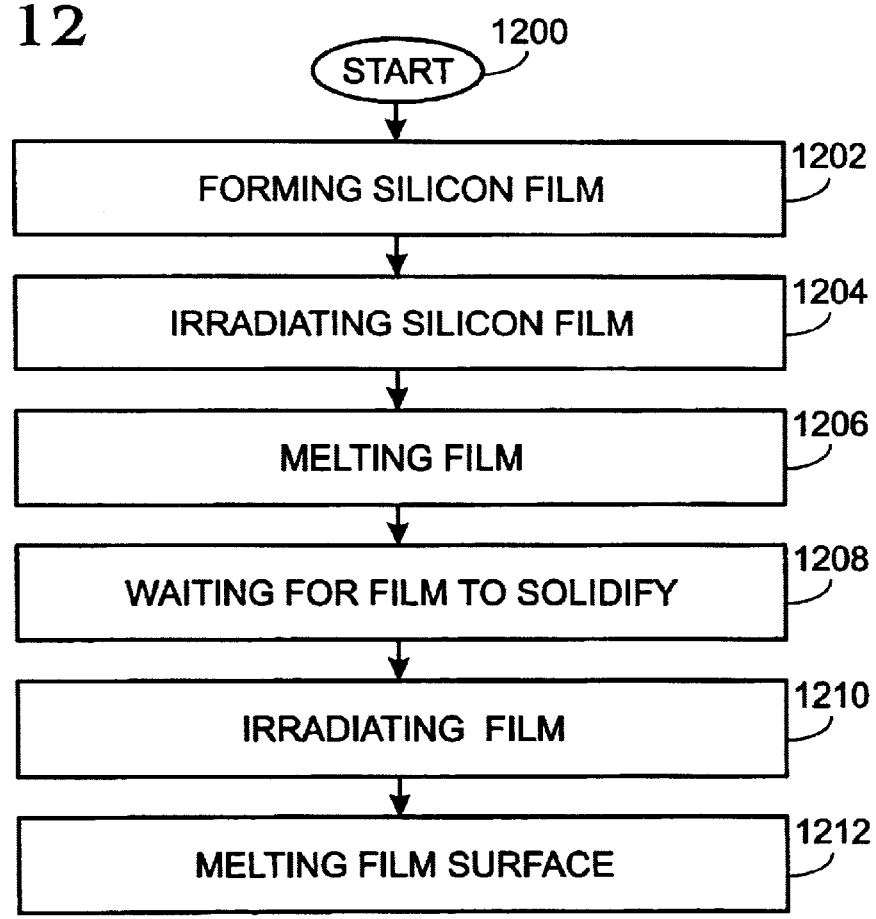
FIG. 12 is a flowchart illustrating an alternate method for planarizing a surface as crystal grains are laterally grown in the fabrication of crystallized silicon films.

FIG. 12 is a flowchart illustrating an alternate method for planarizing a surface as crystal grains are laterally grown in the fabrication of crystallized silicon films. The method begins at Step 1200. Step 1202 forms a film of amorphous silicon with a surface and a plurality of areas. Step 1202 typically includes forming a film having a thickness in the range of 100 to 1000 Å. Step 1204 irradiates an area of the silicon film with a first laser pulse. Step 1206, in response to the first laser pulse, melts the silicon film. Step 1208 waits for the silicon film to solidify. Step 1210 irradiates the area of the silicon film with a second laser pulse. Step 1212, in response to the second laser pulse, melts the silicon film surface. Irradiating with the first and second pulses in Step 1204 and 1210 includes irradiating with a laser wavelength of less than 550 nanometers Waiting for the silicon film to solidify in Step 1208 includes separating the first pulse from the second pulse with a temporal separation in the range from 30 to 500 nanoseconds (ns). Irradiating with a first pulse and a second pulse in Steps 1204 and 1210 includes forming first and second pulses having a pulse width in the range of 20 to 100 ns, as measured at their full-width-half-maximum.

In some aspects, irradiating with a first pulse in Step 1204 includes irradiating with a first pulse having a first intensity. Irradiating with a second pulse in Step 1210 includes irradiating with a second pulse having a second intensity equal to the first intensity. Alternately, the second intensity is less than the first intensity.

In some aspects, Step 1210 irradiates with a second pulse having a second intensity in the range of 0.1 to 0.8 of the first intensity. Irradiating with a first pulse (Step 1204) and a second pulse (Step 1210) includes forming first and second pulses having a first pulse width, as measured at their full-width-half-maximum, and waiting for the film to solidify in Step 1208 includes creating a separation between pulses that is greater than the first pulse width.

Alternately, Step 1210 irradiates with a second pulse having a second intensity in the range of 0.5 to 0.9 of the first intensity. Waiting in Step 1208 includes creating a separation between pulses that is less than the first pulse width.

Melting the silicon film surface in response to the second laser pulse in Step 1212 includes controlling the silicon surface flatness within a range of 50 to 500 Å. Preferably, the silicon surface flatness is within a range of 50 to 200 Å.

When Step 1204 irradiates an area of the silicon film having a first length equal to the beam width, then melting the silicon film in response to the first laser pulse in Step 1204 includes laterally growing crystal grains by a length approximately equal to the first length.

A method for crystallizing a silicon film by using a sequence of laser pulses has been described above. The lateral growth length and the film surface flatness can be varied by manipulating the pulse width, the separation between pulses, and the relative pulse intensities. Specific examples are given for a sequence of two pulses, however, the invention is not limited to any particular number of pulses. Other variations and embodiments of the invention will occur to those skilled in the art.

We claim:

1. A silicon film formed from a pulsed laser sequence crystallization process, the silicon film comprising:

a silicon film having a plurality of irradiation areas including laterally grown grains of crystallized silicon;

a plurality of temporary ridges formed in the center of each irradiation area of the silicon film; and a planar silicon film surface extending across the silicon film irradiation areas.

2. The silicon film of claim 1 wherein the temporary ridges formed in the center of each irradiation area of the silicon film have a height in the range of 600 to 1000 Å.

3. The silicon film of claim 1 wherein the planar silicon film surface extending across the silicon film irradiation areas has a flatness in the range of 50 to 500 Å.

4. The silicon film of claim 1 wherein the planar silicon film surface extending across the silicon film irradiation areas has a flatness in the range of 50 to 200 Å.

5. The silicon film of claim 1 wherein the silicon film has a thickness in the range of 100 to 1000 Å.

6. A silicon film formed from a pulsed laser sequence crystallization process, the silicon film comprising:

a silicon film having a plurality of irradiation areas including laterally grown grains of crystallized silicon;

a plurality of temporary ridges formed in the center of each irradiation area of the silicon film; and a plurality of permanent ridges formed in the center of each irradiation area of the silicon film.

7. The silicon film of claim 6 wherein the temporary ridges formed in the center of each irradiation area of the silicon film have a height in the range of 600 to 1000 Å.

8. The silicon film of claim 6 wherein the permanent ridges formed in the center of each irradiation area of the silicon film have a height in the range of 50 to 500 Å.

9. The silicon film of claim 6 wherein the permanent ridges formed in the center of each irradiation area of the silicon film have a height in the range of 50 to 200 Å.

10. The silicon film of claim 6 wherein the silicon film has a thickness in the range of 100 to 1000 Å.

* * * * *